(12) United States Patent
Shigematsu

(10) Patent No.: US 7,323,947 B2
(45) Date of Patent: Jan. 29, 2008

(54) OSCILLATOR CIRCUIT

(75) Inventor: Hisao Shigematsu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/023,594

(22) Filed: Dec. 29, 2004

(65) Prior Publication Data
US 2006/0033590 A1 Feb. 16, 2006

(30) Foreign Application Priority Data
Aug. 13, 2004 (JP) ............... 2004-235956

(51) Int. Cl.
H03B 1/00 (2006.01)

(52) U.S. Cl. ............ 331/177 V; 331/107 SL; 331/108 C; 331/36 C; 331/74; 331/117 R; 331/167

(58) Field of Classification Search ......... 331/117 FE, 331/167, 117 R, 74, 177 V, 107 SL, 108 C, 331/36 C
See application file for complete search history.

(56) References Cited

U.S. PATENT DOCUMENTS

| 4,658,440 | A | * | 4/1987 | Pavio et al. ................. 455/324 |
| 5,122,765 | A | * | 6/1992 | Pataut ........................ 332/105 |
| 6,842,081 | B2 | * | 1/2005 | Wang et al. ............ 331/117 R |
| 6,930,562 | B2 | * | 8/2005 | Takinami et al. ........ 331/117 R |

FOREIGN PATENT DOCUMENTS

| JP | 2000-307423 A | 11/2000 |
| JP | 2003-168924 A | 6/2003 |

* cited by examiner

Primary Examiner—Arnold Kinkead
(74) Attorney, Agent, or Firm—Arent Fox LLP

(57) ABSTRACT

An oscillator circuit includes first and second transistors forming a differential pair, an output combiner connected to first terminal sides of the first and second transistors, and a current source connected to second terminal sides of the first and second transistors.

25 Claims, 4 Drawing Sheets

F I G. 3A
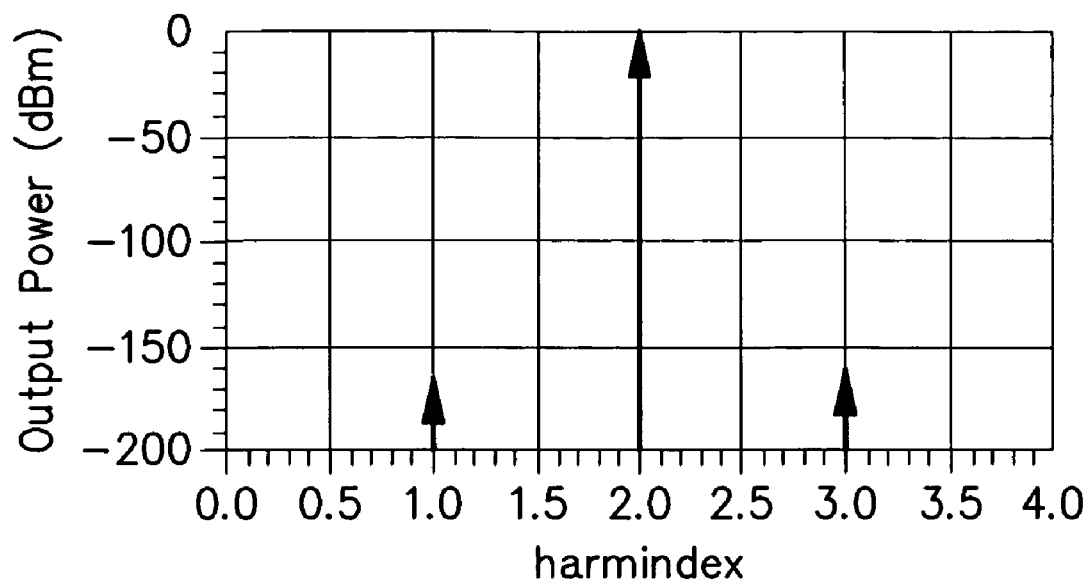
F I G. 3B
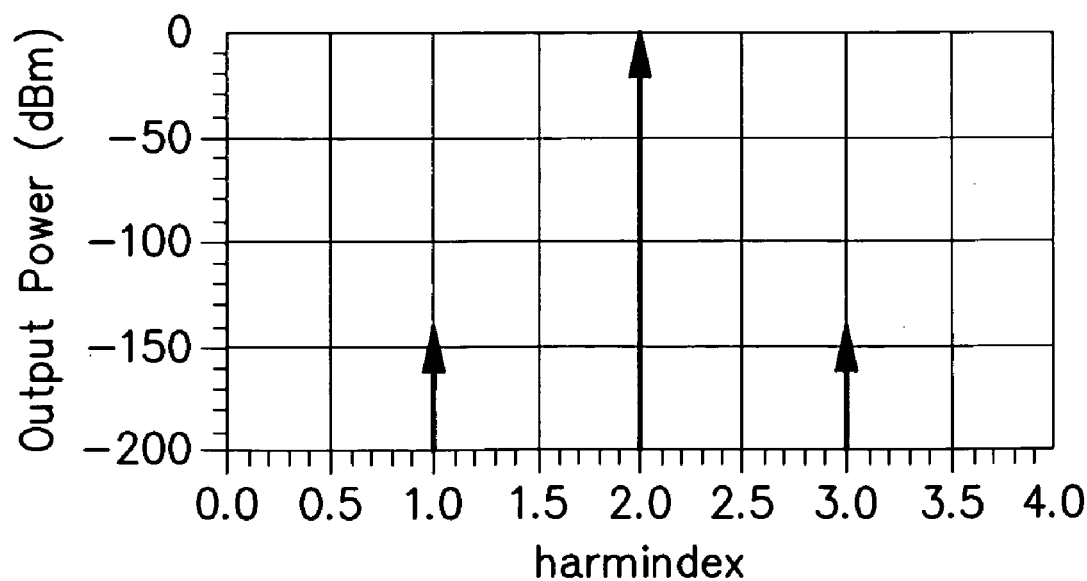

F I G. 6A
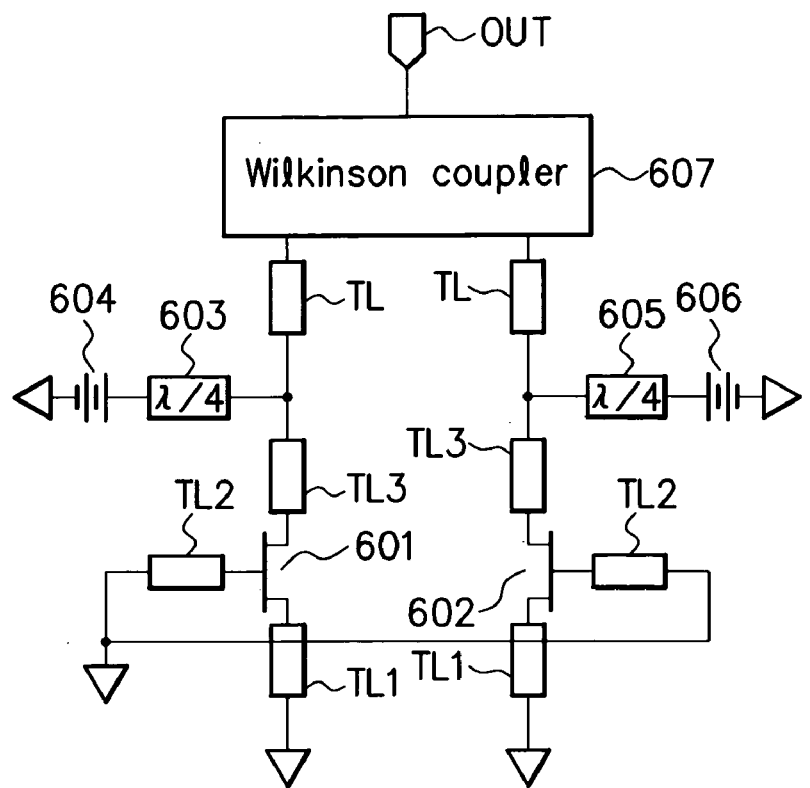
F I G. 6B
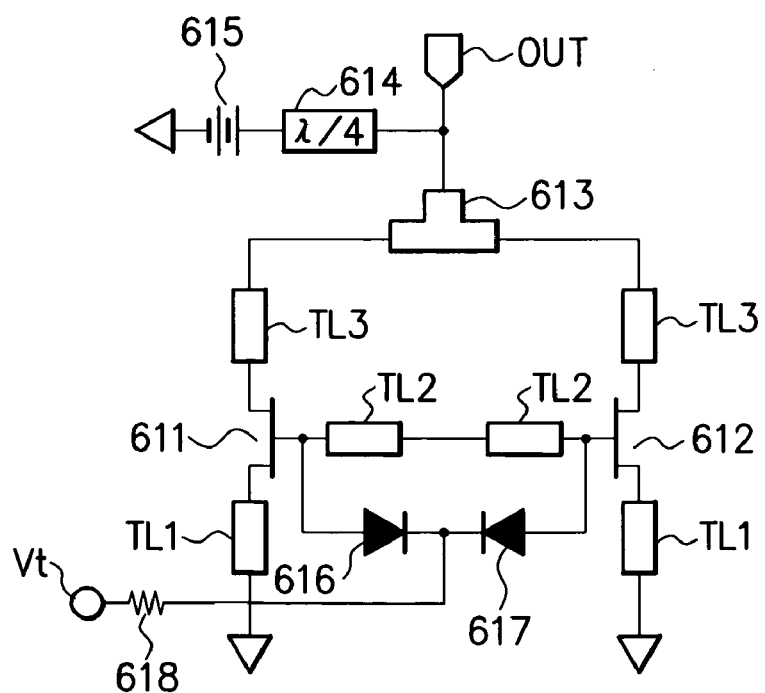

OSCILLATOR CIRCUIT

CROSS-REFERENCE TO RELATED APPLICATIONS

This application is based upon and claims the benefit of priority from the prior Japanese Patent Application No. 2004-235956, filed on Aug. 13, 2004, the entire contents of which are incorporated herein by reference.

BACKGROUND OF THE INVENTION

1. Field of the Invention

The present invention relates to an oscillator circuit, and more particularly to an oscillator circuit having transistors forming a differential pair.

2. Description of the Related Art

Recently, with the Internet becoming rapidly widespread, demands for high-speed communication systems that can transmit and receive a large capacity of data are growing so that their bit rates tend to be more and more increasing. Nowadays, it is said that the bit rate has reached 160 G bps. Demands for wireless communication are also concurrently growing. To achieve these systems, an oscillator circuit used in both transmitter and receiver is important and indispensable.

Conventionally, LC oscillators have been used in which a loss generated in a resonator comprising an inductor (L) and a capacitor (C) is compensated by a negative resistance of a transistor to obtain continuous oscillation. Recently, so-called push-push oscillators utilizing harmonic waves have emerged, enabling the oscillator to oscillate with a higher frequency than the maximum oscillation frequency generated by a single transistor oscillator.

Low power oscillators or transmission systems, having a resonance circuit including a pair of transistors connected in cascade, are described in Japanese Patent Application Laid-Open No. 2000-307423. In Japanese Patent Application Laid-Open No. 2003-168924, a voltage control circuit utilizing a differential amplifier is described.

SUMMARY OF THE INVENTION

An object of the present invention is to provide a compact oscillator circuit.

Another object of the present invention is to provide an oscillator circuit that can reduce the phase noise.

According to an aspect of the present invention, there is provided an oscillator circuit comprising: first and second transistors forming a differential pair; an output combiner connected to first terminal sides of the first and second transistors; and a current source connected to second terminal sides of the first and second transistors.

BRIEF DESCRIPTION OF THE DRAWINGS

FIG. 3A illustrates a harmonic distribution of the oscillation output power of the oscillator circuit according to the embodiment in FIG. 2;

FIG. 3B illustrates a harmonic distribution of the oscillation output power of the oscillator circuit in FIG. 6B

FIG. 6A is a circuit diagram illustrating the structure of a push-push oscillator; and FIG. 6B is a circuit diagram illustrating the structure of another push-push oscillator.

DETAILED DESCRIPTION OF THE PREFERRED EMBODIMENTS

Figure 1:
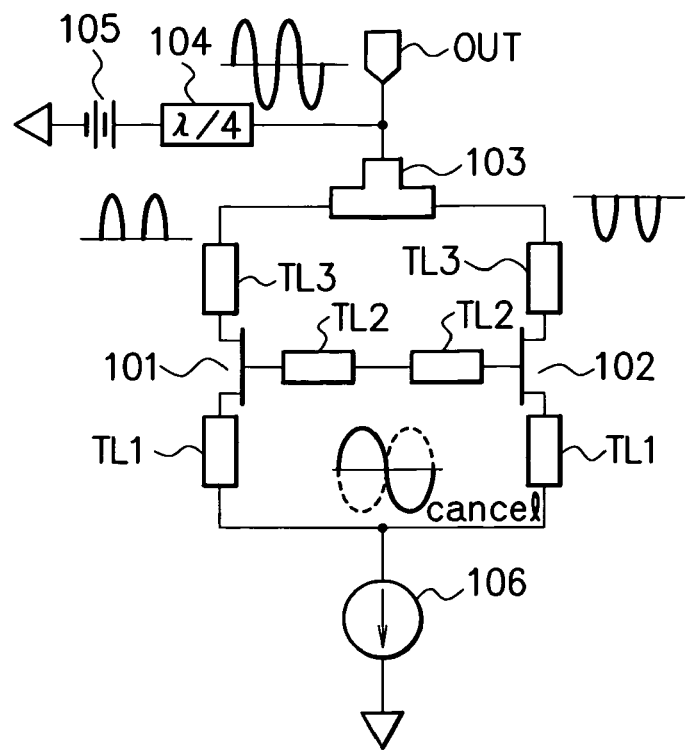
FIG. 1 is a circuit diagram illustrating the structure of a push-push oscillator of a first embodiment according to the present invention.

FIG. 6A is a circuit diagram illustrating the structure of a push-push oscillator. The gate terminals (referred to below as 'gates') of field effect transistors (FETs) 601 and 602 are each connected through a transmission line TL2 to the ground. The source terminals (referred to below as 'sources') of the transistors 601 and 602 are each connected through a transmission line TL1 to the ground. A direct current power source 604 is coupled through a transmission line 603 to the drain terminal (referred to below as 'drain') of the transistor 601. Similarly, a direct current source 606 is coupled through a transmission line 605 to the drain of the transistor 602. A Wilkinson coupler 607 including a resistor circuit (not shown) is coupled through a transmission line TL to each drain of the transistors 601 and 602, and outputs an oscillation signal from an output terminal OUT.

The transistors 601 and 602 each form a single oscillator. The transmission lines 603 and 605 have a length equal to one-fourth the wavelength $\lambda$ of the fundamental frequency of these oscillators. Adjustments are performed to satisfy the condition for the transistors 601 and 602 to oscillate. The phases of the oscillation signals generated by the transistors 601 and 602 can be mutually inverted (shifted by 180 degrees) by adjusting the transmission line TL2 connected to each gate of the transistors 601 and 602. The Wilkinson coupler 607 combines these two oscillation signals and outputs the combined oscillation signal from the output terminal OUT. As a result, the fundamental frequency components of the two oscillation signals mutually cancel out and the second-harmonic components are combined to output the oscillation signal.

FIG. 6B is a circuit diagram illustrating the structure of another push-push oscillator. The gates of field effect transistors 611 and 612 are mutually connected to each other through a transmission line TL2. The sources of the transistors 611 and 612 are each connected through a transmission line TL1 to the ground. An output combiner 613 is connected through a transmission line TL3 to each drain of the transistors 611 and 612, and outputs an oscillation signal from an output terminal OUT. A direct current power source 615 is connected through a transmission line 614 to the output terminal OUT. The cathodes of varactor diodes 616 and 617 are mutually connected to each other. The anodes of the varactor diodes 616 and 617 are connected to the gates of the transistors 611 and 612, respectively. A varactor control terminal Vt is connected through a resistor 618 to the mutually connected cathodes of the varactor diodes 616 and 617.

To use the Wilkinson coupler 607 in FIG. 6A, since the output impedance of each of the transistors 601 and 602 needs to be 50 $\Omega$, an impedance matching circuit is required. The output combiner 613 in FIG. 6B directly connects the drains of the transistors 611 and 612 to each other without through a resistor. The phases of the oscillation signals generated by the transistors 611 and 612 can thereby be mutually inverted without adjusting the length of the transmission line TL2 connected to each gate of the transistors 611 and 612. The output combiner 613 combines the two oscillation signals so that the fundamental frequency components of the two oscillation signals mutually cancel out and the second-harmonic components are combined to output the combined oscillation signal. The transmission line 614 has a length equal to one-fourth the wavelength λ of the second-harmonic frequency. The capacitor values of the varactor diodes (variable capacitors) 616 and 617 are varied by controlling the voltage at the varactor control terminal Vt, whereby the frequency of the oscillation signal output from the output terminal OUT can be controlled.

A problem with the oscillator circuit in FIG. 6A, however, is that the combined two oscillators require the respective bias circuits 604 and 606 and therefore a large occupied area. Another problem is that, since the phases of the oscillation signals need to be mutually inverted (shifted by 180 degrees) and added to each other, the length of the transmission line TL2 connected to each gate of the transistors 601 and 602 becomes longer, thereby requiring a very large area. Still another problem is that the oscillation output power is small. To improve these problems, the oscillator circuit shown in FIG. 6B may be adopted, but it has a problem of insufficient phase noise characteristics. The problem with the phase noise is that the fundamental and harmonic components other than the second-harmonic component to be combined are not sufficiently reduced.

First Embodiment

FIG. 1 is a circuit diagram showing the structure of a push-push oscillator of a first embodiment according to the present invention. The gates of field effect transistors 101 and 102 are mutually connected to each other through a transmission line TL2. The sources of the transistors 101 and 102 are each connected through a transmission line TL1 and a common current source 106 to the ground (reference voltage level) and are virtually grounded. The virtual ground here means that it maintains ground potential from high-frequency behavior point of view. An output combiner 103 is connected through a transmission line TL3 to each drain of the transistors 101 and 102, and outputs an oscillation signal from an output terminal OUT. A direct current power source 105 is connected through a transmission line 104 to the output terminal OUT.

The current source 106 is a constant current source that makes the sum of the currents conducted through the transistors 101 and 102 constant. The fundamental frequency components of the oscillation signals generated by the transistors 101 and 102 are thereby shifted in phase by 180 degrees and mutually inverted. Therefore, the fundamental frequency components of the two oscillation signals mutually cancel out. Since the output combiner 103 directly connects the drains of the transistors 101 and 102 to each other without through a resistor as in FIG. 6B, the phases of the oscillation signals generated by the transistors 101 and 102 can be mutually inverted without adjusting the length of the transmission line TL2 connected to each gate of the transistors 101 and 102. The output combiner 103 combines the two oscillation signals so that the fundamental frequency components of the two oscillation signals mutually cancel out and only the second-harmonic components are combined to output the combined oscillation signal. The transmission line 104 has a length equal to one-fourth the wavelength λ of the second-harmonic frequency.

According to the present embodiment, using a differential pair comprising the two transistors 101 and 102 and the current source 106 supplying a total sink current thereto enables the mutually connected source terminals to be regarded as a virtual ground. At the source terminals, the first-harmonic waves (fundamental waves) mutually cancel out and only the second-harmonic components are combined to generate the second-harmonic wave. Using the current source 106 can cancel the first- and third-harmonic waves at the source terminals as compared to the circuit in FIG. 6B, thereby improving the phase noise. Further, the output combiner 103 connected to the drain sides of the transistors 101 and 102 combines the output signals, thereby obtaining a compact oscillator circuit.

As described above, the first and second transistors 101 and 102 form a differential pair. The output combiner 103 is connected to the first terminal (drain terminal) sides of the first and second transistors 101 and 102. The current source 106 is connected to the second terminal (source terminal) sides of the transistors 101 and 102.

Using the current source 106 can provide a compact oscillator circuit that can reduce the phase noise. In the circuit in FIG. 6A, the two transistors 601 and 602 require the respective bias circuits 604 and 606, whereas, in the present embodiment, the two transistors 101 and 102 do not require them, but require only the single bias circuit 105. Therefore, the present embodiment can make the oscillator circuit smaller. In the circuit in FIG. 6A, the length of the transmission line TL2 connected to each gate of the transistors 601 and 602 needs to be adjusted to control the phases of the oscillation signals, whereas, in the present embodiment, the phases are adjusted not by the length of the transmission line TL2, but by the output combiner 103 and current source 106. Therefore, the present embodiment can prevent an area occupied by the circuit from becoming larger with longer transmission lines, thereby achieving a compact oscillator circuit. In the circuit in FIG. 6B, since the phases are adjusted only by the output combiner 613, the fundamental and higher harmonic components other than the second-harmonic component cannot be sufficiently reduced. In the present embodiment, the current source 106 is provided in addition to the output combiner 103, whereby the fundamental and higher harmonic components other than the second-harmonic component can be sufficiently reduced, thereby reducing the phase noise. The push-push oscillator circuit utilizing harmonic waves can thus oscillate with a higher frequency than the maximum oscillation frequencies generated by the transistors 101 and 102.

Second Embodiment

Figure 2:
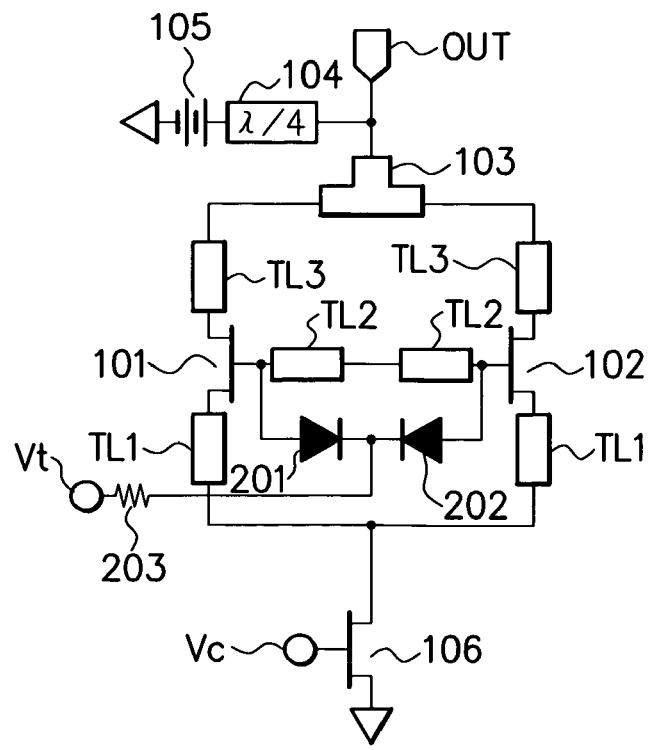
FIG. 2 is a circuit diagram illustrating the structure of a push-push oscillator of a second embodiment according to the present invention.

FIG. 2 is a circuit diagram showing the structure of a push-push oscillator of a second embodiment according to the present invention. Only points in which the present embodiment differs from the first embodiment (FIG. 1) will be described.

The cathodes of varactor diodes 201 and 202 are mutually connected to each other. The anodes of the varactor diodes 201 and 202 are connected to the gates (control terminals) of transistors 101 and 102, respectively. A varactor control terminal Vt is connected through a resistor 203 to the mutually connected cathodes of the varactor diodes 201 and 202. A single field effect transistor is used as a current source 106, the transistor being connected such that its gate is connected to a current source control terminal Vc, its source to the ground, and its drain to the mutually connected sources of the transistors 101 and 102.

In the present embodiment, as in the first embodiment, using a differential pair comprising the two transistors 101 and 102 and the current source 106 supplying a total sink current thereto enables the sources of the transistors 101 and 102 to be regarded as a virtual ground. Signals having mutually different polarities can thereby be obtained from both sides of the transistors 101 and 102, forming a very compact circuit structure. Therefore, the first-harmonic waves (fundamental waves) mutually cancel out and only the second-harmonic components are combined to generate the second-harmonic wave. Using the current source 106 can cancel out the first- and third-harmonic waves at the source terminals as compared to the circuit in FIG. 6B, so the ratio of the second-harmonic and fundamental waves and the ratio of the second- and third-harmonic waves can be improved, thereby improving the phase noise (see FIGS. 3A and 3B). Further, using the output combiner 103 at the drain side can directly drive a load without using a source follower, which is required when a signal is output from the gate, so a compact circuit is obtained and the oscillation output power is also increased.

In the second embodiment, since the capacitor values of the varactor diodes 201 and 202 are varied by controlling the voltage at the varactor control terminal Vt, the frequency of the oscillation signal output from the output terminal OUT can be controlled. Further, since the current of the current source 106 is varied by adjusting the voltage at the current source control terminal Vc, the oscillation output power from the output terminal OUT can be changed (see FIG. 4).

FIG. 3A illustrates a harmonic distribution of the oscillation output power of the oscillator circuit according to the present embodiment in FIG. 2. FIG. 3B illustrates a harmonic distribution of the oscillation output power of the oscillator circuit in FIG. 6B. The vertical axis shows the output power [dBm] from the output terminal OUT and the horizontal axis shows the harmonic index (harmindex). In the harmindices on the horizontal axis, '1.0' indicates the fundamental wave, '2.0' indicates the second-harmonic wave, and '3.0' indicates the third-harmonic wave.

In the oscillator circuit characteristics of the present embodiment in FIG. 3A, the oscillation output powers of the fundamental and third-harmonic waves become smaller as compared to those in the oscillator circuit characteristics in FIG. 3B. In these oscillator circuits, oscillation signals of the fundamental and higher harmonic waves other than the second-harmonic wave are unnecessary because they will cause the phase noise. In the present embodiment, using the current source 106 can sufficiently reduce the fundamental and higher harmonic components other than the second-harmonic component, thereby reducing the phase noise.

Figure 4:
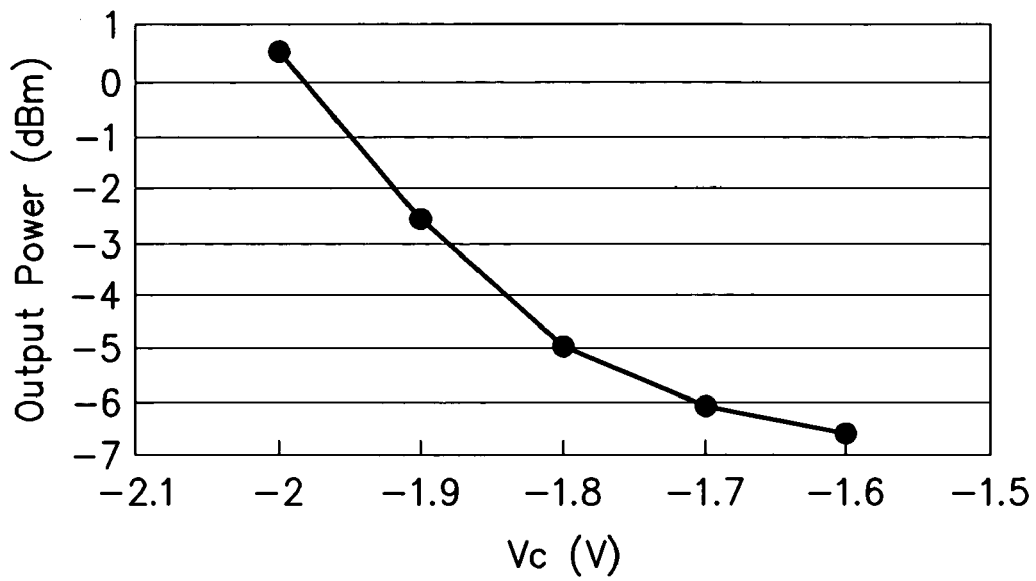
FIG. 4 is a graph illustrating an oscillation output power controlled by a current source control terminal Vc.

FIG. 4 is a graph illustrating the oscillation output power controlled by the current source control terminal Vc. The horizontal axis shows the voltage [V] at the current source control terminal Vc in FIG. 2 and the vertical axis shows the output power [dBm] from the output terminal OUT. As shown in FIG. 4, the oscillation output power from the output terminal OUT can be changed by adjusting the voltage at the current source control terminal Vc.

Third Embodiment

Figure 5:
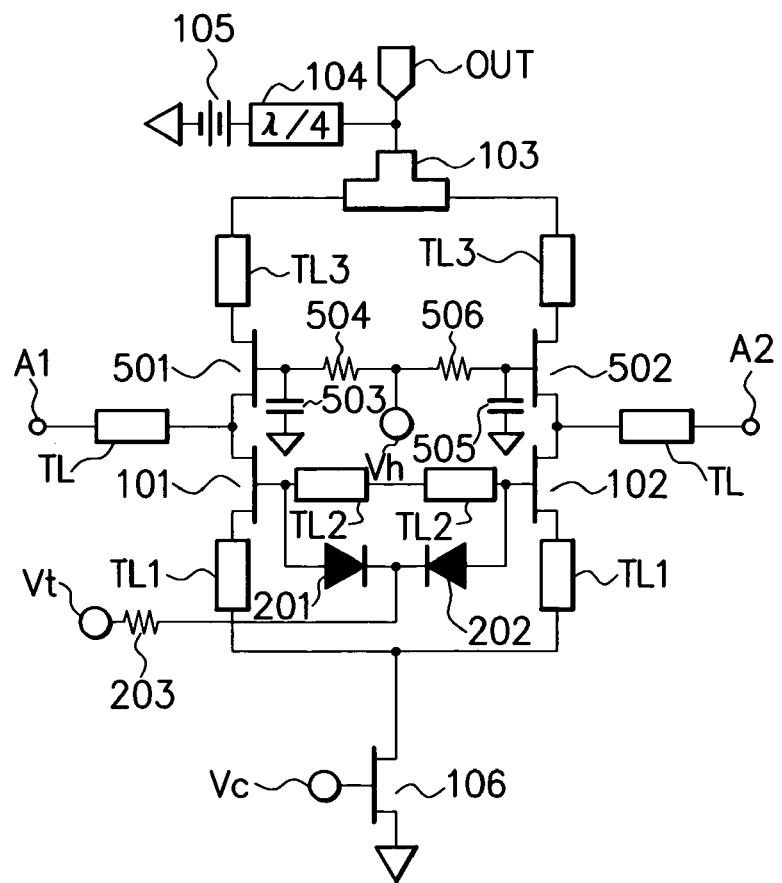
FIG. 5 is a circuit diagram illustrating the structure of a cascade type push-push oscillator of a third embodiment according to the present invention.

FIG. 5 is a circuit diagram showing the structure of a cascade type push-push oscillator of a third embodiment according to the present invention. Only points in which the present invention differs from the second embodiment (FIG. 2) will be described below.

A field effect transistor 501 is connected such that its gate is connected through a resistor 504 to a high harmonic control terminal Vh, its source is connected to the drain of a transistor 101, and its drain is connected through a transmission line TL3 to an output combiner 103. Similarly, a field effect transistor 502 is connected such that its gate is connected through a resistor 506 to the high harmonic control terminal Vh, its source is connected to the drain of a transistor 102, and its drain is connected through a transmission line TL3 to the output combiner 103. A capacitor 503 is connected between the gate of the transistor 501 and the ground. Similarly, a capacitor 505 is connected between the gate of the transistor 502 and the ground. An output terminal A1 is connected through a transmission line TL to the common node shared by the transistors 101 and 501. Similarly, an output terminal A2 is connected through a transmission line TL to the common node shared by the transistors 102 and 502.

In the present embodiment, the transistors 501 and 502 are thus connected in cascade to the transistors 101 and 102, respectively. The present embodiment can thereby not only facilitate the oscillations at high frequencies, but also reduce an effect of an output load on the transistors used for the oscillations, in comparison with the first and second embodiments.

Further, high harmonic components can be controlled by controlling the voltage at the high harmonic control terminal Vh coupled to the gates of the transistors 501 and 502. Specifically, the shape of the output wave can be changed. The resistors 504 and 506 and the capacitors 503 and 505 may be removed. That is, the gates of the transistors 501 and 502 may be directly connected to the high harmonic control terminal Vh.

Furthermore, the mutually inverted fundamental frequency waves can be simultaneously output from the output terminals A1 and A2. Thus, the fundamental waves can be obtained from the output terminals A1 and A2, while the second-harmonic wave can be obtained from the output terminal OUT. In the first and second embodiments, since only the second-harmonic wave is output, dividers and doublers are required to obtain other frequency signals, whereas, in the present embodiment, since the fundamental and second-harmonic waves can be obtained simultaneously, dividers and doublers are not required, thereby obtaining a compact oscillator circuit.

In the first to third embodiments, examples have been described in which field effect transistors are used, but bipolar transistors may also be used in place of field effect transistors. In this case, the gate, source, and drain of a field effect transistor correspond to the base, emitter, and collector of a bipolar transistor, respectively.

The above-described embodiments have been shown only as embodied examples for carrying out the invention, and the scope of the present invention is not limited to these embodiments. Namely, it is to be understood that changes and variations may be made without departing the technical spirit or scope, and essential feature of the present invention.

Using the current source can provide a compact oscillator circuit that can reduce the phase noise. This compactness comes from elimination of bias circuits connected to the two transistors. The phases are adjusted not by the lengths of transmission lines but by the output combiner and current source, which prevents the lengths of the transmission lines from becoming longer and therefore the size of the circuit from becoming larger, thereby obtaining a compact circuit. The current source provided in addition to the output combiner can reduce the phase noise.

What is claimed is:

1. An oscillator circuit comprising:
   first and second transistors forming a differential pair;
   an output combiner directly connected to first terminal sides of the first and second transistors through transmission lines; and
   a current source connected to second terminal sides of the first and second transistors, wherein
   the first and second transistors each are a field effect transistor;
   the output combiner is connected to drain terminal sides of the first and second field effect transistors; and
   the current source is connected to source terminal sides of the first and second field effect transistors.

2. The oscillator circuit according to claim 1, further comprising third and fourth transistors connected in cascade to the first and second transistors, respectively, wherein:
   the current source is connected to second terminal sides of the third and fourth transistors.

3. The oscillator circuit according to claim 1, further comprising:
   first and second varactors connected to control terminals of the first and second transistors, respectively; and
   a varactor control terminal connected through the first and second varactors to the respective control terminals of the first and second transistors.

4. The oscillator circuit according to claim 1, wherein
   the control terminals of the first and second transistors are directly connected to each other through transmission line.

5. The oscillator circuit according to claim 4, further comprising a harmonic control terminal connected to the mutually connected control terminals of the first and second transistors.

6. The oscillator circuit according to claim 5, further comprising:
   first and second resistors connected between the harmonic control terminal and the control terminal of the first transistor and between the harmonic control terminal and the control terminal of the second transistor, respectively; and
   first and second capacitors connected between a reference voltage level and the control terminal of the first transistor and between the reference voltage level and the control terminal of the second transistor, respectively.

7. The oscillator circuit according to claim 1, further comprising third and fourth field effect transistors connected in cascade to the first and second field effect transistors, respectively, wherein:
   the output combiner is connected to drain terminal sides of the third and fourth field effect transistors; and
   the current source is connected to the source terminal sides of the first and second field effect transistors.

8. The oscillator circuit according to claim 1, further comprising:
   first and second varactors connected to gate terminals of the first and second field effect transistors, respectively; and
   a varactor control terminal connected through the first and second varactors to the gate terminals of the first and second field effect transistors, respectively.

9. The oscillator circuit according to claim 1, wherein gate terminals of the first and second field effect transistors are connected to each other.

10. The oscillator circuit according to claim 9, further comprising a harmonic control terminal connected to the mutually connected gate terminals of the first and second field effect transistors.

11. The oscillator circuit according to claim 10, further comprising:
    first and second resistors connected between the harmonic control terminal and the gate terminal of the first field effect transistor and between the harmonic control terminal and the gate terminal of the second field effect transistor, respectively; and
    first and second capacitors connected between a reference voltage level and the gate terminal of the first field effect transistor and between the reference voltage level and the gate terminal of the second field effect transistor, respectively.

12. The oscillator circuit according to claim 1, further comprising a direct current power source connected to an output terminal of the output combiner.

13. An oscillator circuit comprising:
    first and second transistors forming a differential pair;
    an output combiner directly connected to first terminal sides of the first and second transistors through transmission lines;
    a current source connected to second terminal sides of the first and second transistors; and
    a direct current power source connected to an output terminal of the output combiner, wherein
    the first and second transistors each are a bipolar transistor;
    the output combiner is connected to collector terminal sides of the first and second bipolar transistors; and
    the current source is connected to emitter terminal sides of the first and second bipolar transistors.

14. The oscillator circuit according to claim 13, further comprising third and fourth bipolar transistors connected in cascade to the first and second bipolar transistors, respectively, wherein:
    the output combiner is connected to collector terminal sides of the third and fourth bipolar transistors; and
    the current source is connected to the emitter terminal sides of the first and second bipolar transistors.

15. The oscillator circuit according to claim 13, further comprising:
    first and second varactors connected to base terminals of the first and second bipolar transistors, respectively; and
    a varactor control terminal connected through the first and second varactors to the respective base terminals of the first and second bipolar transistors.

16. The oscillator circuit according to claim 13, wherein base terminals of the first and second bipolar transistors are connected to each other.

17. The oscillator circuit according to claim 16, further comprising a harmonic control terminal connected to the mutually connected base terminals of the first and second bipolar transistors.

18. The oscillator circuit according to claim 17, further comprising:
    first and second resistors connected between the harmonic control terminal and the base terminal of the first bipolar transistor and between the harmonic control terminal and the base terminal of the second bipolar transistor, respectively; and
    first and second capacitors connected between a reference voltage level and the base terminal of the first bipolar transistor and between the reference voltage level and the base terminal of the second bipolar transistor, respectively.

19. An oscillator circuit comprising:

first and second transistors forming a differential pair;

an output combiner directly connected to first terminal sides of the first and second transistors through transmission lines a current source connected to second terminal sides of the first and second transistors; and a direct current power source connected to an output terminal of the output combiner.

20. The oscillator circuit according to claim 19, further comprising third and fourth transistors connected in cascade to the first and second transistors, respectively, wherein:

the current source is connected to second terminal sides of the third and fourth transistors.

21. The oscillator circuit according to claim 19, further comprising:

first and second varactors connected to control terminals of the first and second transistors, respectively; and a varactor control terminal connected through the first and second varactors to the respective control terminals of the first and second transistors.

22. The oscillator circuit according to claim 19, wherein the control terminals of the first and second transistors are directly connected to each other through transmission line.

23. The oscillator circuit according to claim 13, further comprising third and fourth transistors connected in cascade to the first and second transistors, respectively, wherein:

the current source is connected to second terminal sides of the third and fourth transistors.

24. The oscillator circuit according to claim 13, further comprising:

first and second varactors connected to control terminals of the first and second transistors, respectively; and a varactor control terminal connected through the first and second varactors to the respective control terminals of the first and second transistors.

25. The oscillator circuit according to claim 13, wherein the control terminals of the first and second transistors are directly connected to each other through transmission line.

* * * * *